(12) United States Patent
Stoneham et al.

(10) Patent No.: US 7,588,966 B2
(45) Date of Patent: Sep. 15, 2009

(54) CHIP MOUNTING WITH FLOWABLE LAYER

(75) Inventors: Edward B. Stoneham, Los Altos, CA (US); Thomas M. Gaudette, Cameron Park, CA (US)

(73) Assignee: Endwave Corporation, San Jose, CA (US)

( * ) Notice: Subject to any disclaimer, the term of this patent is extended or adjusted under 35 U.S.C. 154(b) by 0 days.

(21) Appl. No.: 12/042,144

(22) Filed: Mar. 4, 2008

(65) Prior Publication Data

US 2008/0153206 A1    Jun. 26, 2008

Related U.S. Application Data

(62) Division of application No. 10/883,356, filed on Jun. 30, 2004, now Pat. No. 7,348,666.

(51) Int. Cl.
*H01L 21/44* (2006.01)
*H01L 21/48* (2006.01)
(52) U.S. Cl. .................... 438/118; 438/107; 438/119; 257/E21.499
(58) Field of Classification Search ......... 438/107–108, 438/118–119; 257/E21.499
See application file for complete search history.

(56) References Cited

U.S. PATENT DOCUMENTS 3,370,256 A    2/1968    Baur et al.

(Continued)

FOREIGN PATENT DOCUMENTS

GB    1243764    5/2008

(Continued)

OTHER PUBLICATIONS

Preliminary Examination Report dated May 24, 2006 for Taiwan Patent Application No. 94120177 (now TW patent 1279839), including an English translation prepared by the Taiwanese agent. This TW application corresponds to US patent 7,348,666 issued Mar. 25, 2008, which is the parent of the present divisional application. Seven (7) sheets total.

(Continued)

*Primary Examiner*—Thanhha Pham
(74) *Attorney, Agent, or Firm*—Kolisch Hartwell, PC

(57) ABSTRACT

A circuit structure may be formed in a substrate having a face and an open trench, where one or more chips are to be mounted. At least one bridge may extend across an intermediate portion of the trench, and optionally, may divide the trench into sections. A conductive adhesive layer may be applied to the substrate face and, if included, the bridge. One or more circuit chips may be mounted on the adhesive layer, with at least one edge of one circuit chip adjacent to the trench. Alternatively or additionally, an adhesive layer may be applied to a base of a chip and then mounted to the substrate face, in like fashion. The trench may accommodate excess adhesive flowing out from under the one or more chips, while the bridge retains the adhesive across the width of the trench. If the adhesive is conductive, this provides continuity of the conductive layer on the face of the substrate across the trench. In one example, pairs of circuit chips may be effectively mounted in adjacent relationship for interconnection without interference from excess adhesive.

14 Claims, 2 Drawing Sheets

U.S. PATENT DOCUMENTS

| | | | |
|---|---|---|---|
| 3,613,230 | A | 10/1971 | Griff |
| 4,394,633 | A | 7/1983 | Klein |
| 4,460,880 | A | 7/1984 | Turner |
| 4,673,904 | A | 6/1987 | Landis |
| 4,776,087 | A | 10/1988 | Cronin et al. |
| 4,801,905 | A | 1/1989 | Becker |
| 4,845,311 | A | 7/1989 | Schreiber et al. |
| 5,294,751 | A | 3/1994 | Kamada |
| 5,317,292 | A | 5/1994 | Leeb |
| 5,426,399 | A | 6/1995 | Matsubayashi et al. |
| 5,453,154 | A | 9/1995 | Thomas et al. |
| 5,461,353 | A | 10/1995 | Eberhardt |
| 5,532,658 | A | 7/1996 | Tonegawa et al. |
| 5,574,415 | A | 11/1996 | Peterson |
| 5,581,217 | A | 12/1996 | Macdonald |
| 5,796,165 | A | 8/1998 | Yoshikawa et al. |
| 5,828,555 | A | 10/1998 | Itoh |
| 5,830,797 | A | 11/1998 | Cleeves |
| 5,854,867 | A | 12/1998 | Lee et al. |
| 5,880,657 | A | 3/1999 | Dorschky et al. |
| 6,000,120 | A | 12/1999 | Arledge et al. |
| 6,239,669 | B1 | 5/2001 | Koriyama et al. |
| 6,268,283 | B1 | 7/2001 | Huang |
| 6,268,637 | B1 | 7/2001 | Gardner et al. |
| 6,274,920 | B1 | 8/2001 | Park et al. |
| 6,356,173 | B1 | 3/2002 | Nagata et al. |
| 6,414,385 | B1 | 7/2002 | Huang et al. |
| 6,417,744 | B1 | 7/2002 | Albinsson et al. |
| 6,483,406 | B1 | 11/2002 | Sawa et al. |
| 6,486,755 | B2 | 11/2002 | Aruga |
| 6,495,903 | B2 | 12/2002 | Xu et al. |
| 6,515,222 | B2 | 2/2003 | Underwood et al. |
| 6,580,146 | B2 | 6/2003 | Depetro |
| 6,617,686 | B2 | 9/2003 | Davies |
| 6,646,526 | B2 | 11/2003 | Kinayman et al. |
| 6,653,915 | B1 | 11/2003 | Arledge et al. |
| 6,731,009 | B1 | 5/2004 | Jones et al. |
| 6,759,737 | B2 | 7/2004 | Seo |
| 6,787,893 | B2 | 9/2004 | Nakajima et al. |
| 6,812,742 | B2 | 11/2004 | Otsuka et al. |
| 6,844,236 | B2 | 1/2005 | Ivanov |
| 6,908,825 | B2 | 6/2005 | Xu et al. |
| 6,924,496 | B2 | 8/2005 | Manansala |
| 7,061,092 | B2 | 6/2006 | Akram et al. |
| 7,276,987 | B2 | 10/2007 | Koriyama |
| 2001/0031515 | A1* | 10/2001 | Miyasaka ............ 438/108 |

FOREIGN PATENT DOCUMENTS

| | | |
|---|---|---|
| JP | 63-129632 | 6/1988 |
| JP | 01-146426 | 6/1989 |
| JP | 03-041803 | 2/1991 |
| JP | 03-211870 | 9/1991 |
| JP | 41-139783 | 5/1992 |
| JP | 04-294602 | 10/1992 |
| WO | WO 92/22939 | 12/1992 |
| WO | WO 02/059969 | 8/2002 |

OTHER PUBLICATIONS

International Search Report and Written Opinion of the International Searching Authority mailed May 4, 2006 for PCT application No. PCT/US2005/21140. This PCT application corresponds to US patent 7,348,666 issued Mar. 25, 2008, which is the parent of the present divisional application. Seventeen (17) sheets total.

U.S. Office actions dated Jan. 18, 2007, Jun. 7, 2007, Jul. 27, 2006, and Oct. 31, 2005 for U.S. Appl. No. 10/883,356, now U.S. patent 7,348,666 issued Mar. 25, 2008, which is the parent of the present divisional application. Thirty-six (36) sheets total.

U.S. Office actions dated Nov. 15, 2007, Sep. 14, 2006, May 7, 2007, Mar. 6, 2006, and Jan. 11, 2006 for U.S. Appl. No. 10/882,378 filed Jun. 30, 2004. The '378 application has the same inventors as the '666 patent and the present divisional application. Forty-five (45) sheets.

* cited by examiner

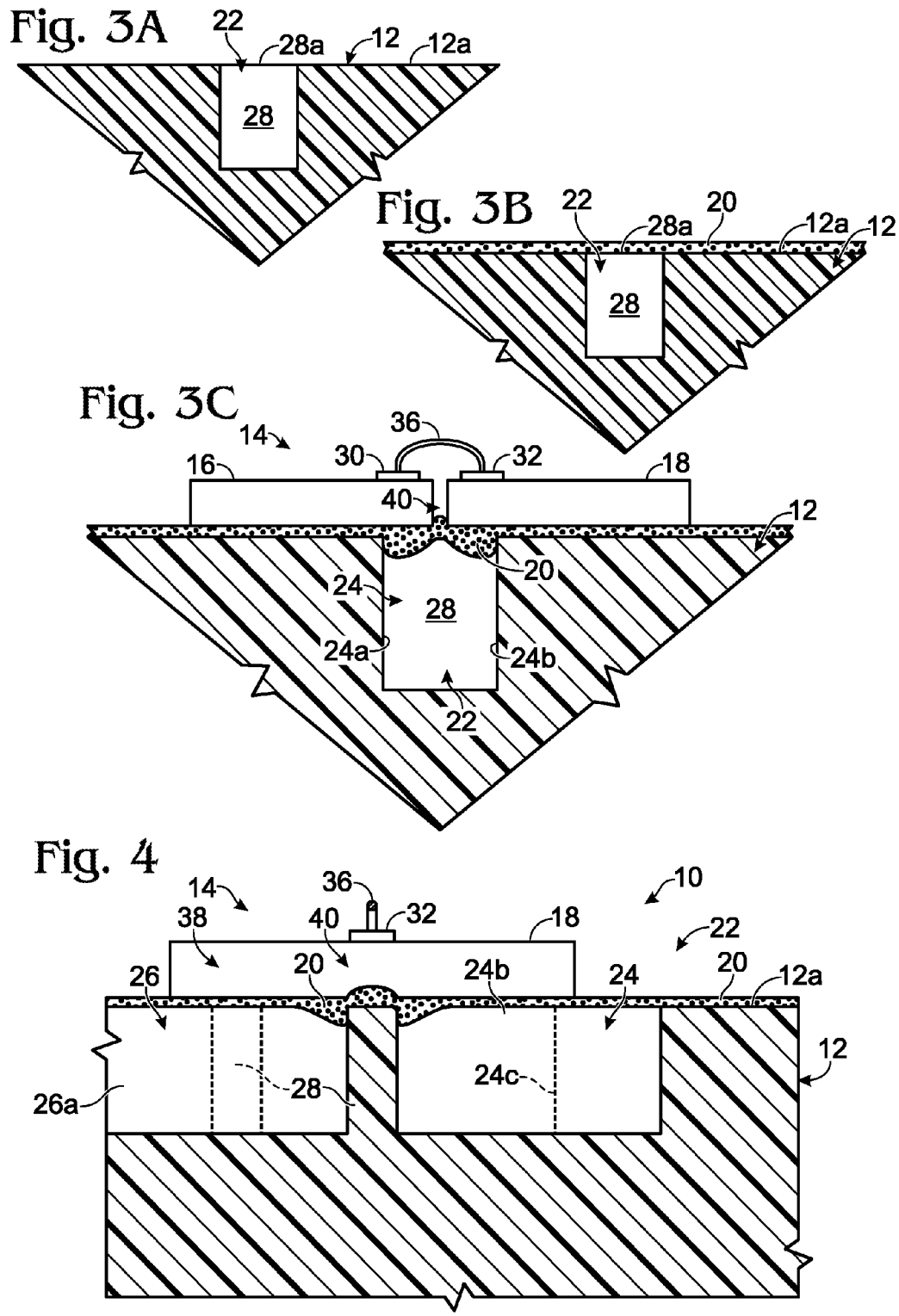

CHIP MOUNTING WITH FLOWABLE LAYER

RELATED APPLICATIONS

This application is a division of application Ser. No. 10/883,356, filed Jun. 30, 2004, which application is incorporated herein by reference in its entirety for all purposes.

BACKGROUND

Some circuits for use at communication frequencies, such as are used for telecommunication and other signal processing applications, involve mounting one component onto another component. An example is mounting an integrated circuit chip to a base substrate. Various mounting techniques may be used. One technique involves using an adhesive to attach or "bond" a chip to a substrate. During this process, adhesive may be squeezed from between the chip and substrate and flow to regions beyond the chip footprint. If the bonding involves two chips or a chip being bonded near another above-the-substrate structure, a likely result is an overflow of adhesive onto contact pads required to interconnect the chip and another circuit component.

BRIEF SUMMARY OF THE DISCLOSURE

A circuit structure may be formed that includes a substrate having a face and an open trench, adjacent to where one or more chips are to be mounted. One or more bridges may extend across an intermediate portion of the trench, and optionally, bifurcates or otherwise divides the trench into sections. An adhesive layer, that may or may not be conductive, may be applied to the substrate face. One or more circuit chips may be mounted on the adhesive layer, with at least one edge of one circuit chip adjacent to the trench. Optionally, an adhesive layer may be applied to the chip base and then mounted to the substrate face, in like fashion. The trench may accommodate excess adhesive. A bridge across the trench may retain the adhesive across the width of the trench. This may extend the adhesive surface area, and when the adhesive is conductive, the bridge may provide continuity of the conductive layer across the face of the substrate. In one example, pairs of circuit chips may be effectively mounted in adjacent relationship for interconnection without interference from excess adhesive by positioning adjacent edges of the chips adjacent the trench.

BRIEF DESCRIPTION OF THE SEVERAL FIGURES

FIGS. 3A and 3B show initial assembly process steps.

FIG. 3C shows a cross-sectional view of FIG. 2 taken along line 3-3, as a final process step.

FIG. 4 shows a cross-sectional view of FIG. 2 taken along line 4-4.

DETAILED DESCRIPTION OF VARIOUS EMBODIMENTS

Figure 1:
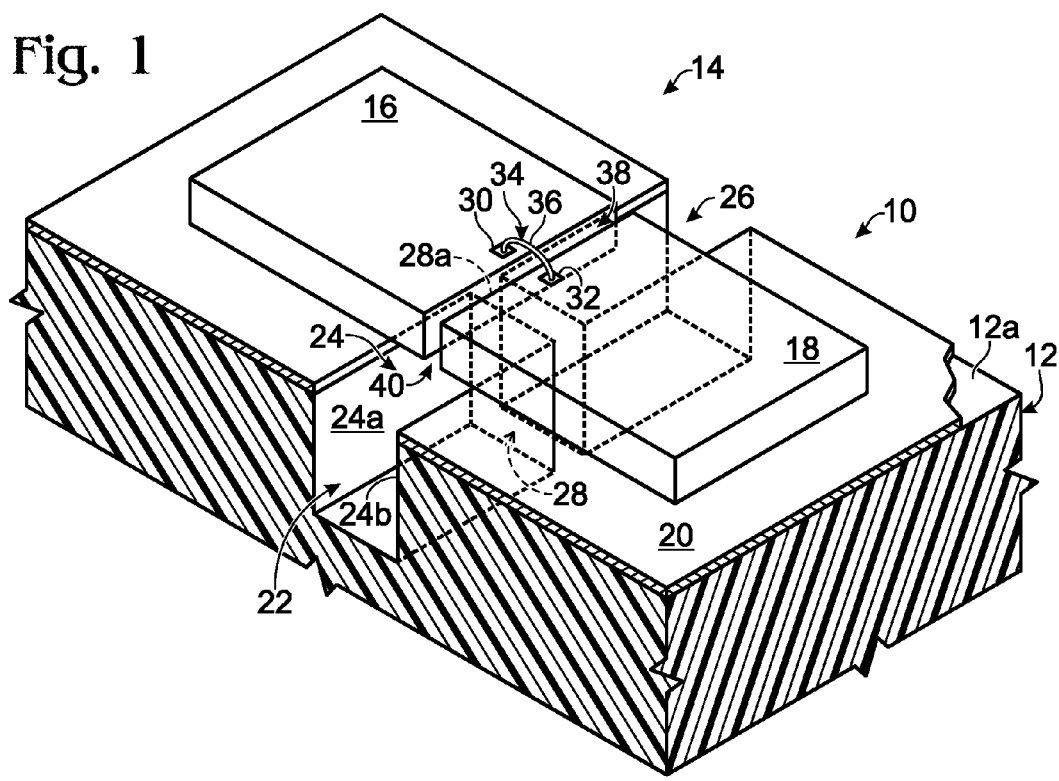
FIG. 1 shows an isometric view of a pair of chips on top of a bridged trench.

Referring to the drawings, FIGS. 1, 2, 3C and 4 show a circuit structure including a base substrate 12 on which are mounted one or more circuit units 14, such as circuit chips 16 and 18. Substrate 12 may be any suitable substrate for supporting circuit units 14. For example, the substrate may be made of one or a combination of dielectric, semiconductive, and conductive materials. Also, the substrate may or may not be printed with one or more circuit elements that are active and/or passive, whether or not any such circuit elements are or are not in a circuit including circuit units 14. Circuit units 14, including circuit chips 16 and 18, may be any suitable active or passive circuit devices, such as, but not limited to, resistors, capacitors, inductors, transmission lines, diodes, and transistors, or a combination of such devices. Accordingly, the circuit chips may include passive and/or active circuit devices, and may be formed on a chip substrate that may be a dielectric, semiconductive or conductive material, or a combination of such materials. A representative example of a chip may include an integrated circuit chip, such as a monolithic microwave integrated circuit (MMIC) or an application specific integrated circuit (ASIC).

As particularly shown in FIGS. 3C and 4, substrate 12 may include a primary face 12a on which an adhesive layer 20 may be placed for holding circuit chips 16 and 18 on the substrate. A trench 22 extends along a length of substrate 12, and may include two or more trench sections 24 and 26. Trench sections 24 and 26 may also be considered to be separate trenches, so the term trench, as used herein, includes one or more separate trenches, whether connected or disconnected, and whether aligned or misaligned. Trench sections 24 and 26 may have sidewalls, such as sidewalls 24a, 24b and 26a, 26b. These sidewalls may define the sides and lengths of the trench sections. The trench may extend beyond the edges of the circuit chips 16 and 18, as shown, or they may end along the circuit chips, such as optional trench end 24c near the outer edge of the chip circuits, as shown in FIG. 4.

One or more bridges, such as bridge 28, may extend across trench 22. In some examples of the circuit structure, there is no bridge 28. In other examples a plurality of bridges 28 may be used, as represented by additional or alternative bridges 28 shown in dashed lines. Any bridge or bridges may be formed during the formation of trench 22. For example, the trenches may be formed by etching, such as with a laser, substrate 12. By etching discontinuous trench sections, a stretch of substrate remaining may form the bridge. In such a case, the bridge may be a wall between trench sections or the substrate between the ends of two trenches. The bridge may also extend over or through an intermediate portion of a continuous trench, leaving a passageway along the trench and under the bridge. Further, a bridge 28 could be grown or inserted into a previously formed trench, as an alternative to leaving a portion non-etched. Thus, the term bridge refers to any suitable structure spanning a width of the trench sufficient to support adhesive layer 20. In some examples, such as circuit structure 10 as shown, the adhesive layer is conductive, and the bridge supports a continuous adhesive layer 20, providing electrical continuity between opposite sides of the trench. The layer support may preferably be provided, by a bridge with an upper surface 28a near substrate surface 12a.

In this example, circuit chips 16 and 18 have respective connection or lead pads, also referred to as terminals 30 and 32 that may be connected to resident circuit structure formed on or in the chips. This resident circuit structure may be connected to external circuit structure via terminals, such as terminals 30 and 32. In this example, an interconnect 34 interconnects terminals 30 and 32. Any device suitable for providing an electrical connection between the terminals, such as a wire, ribbon or bar, may be used. In this example, interconnect 34 is in the form of a bond wire 36 attached, such as by solder, to the terminals.

Figure 2:
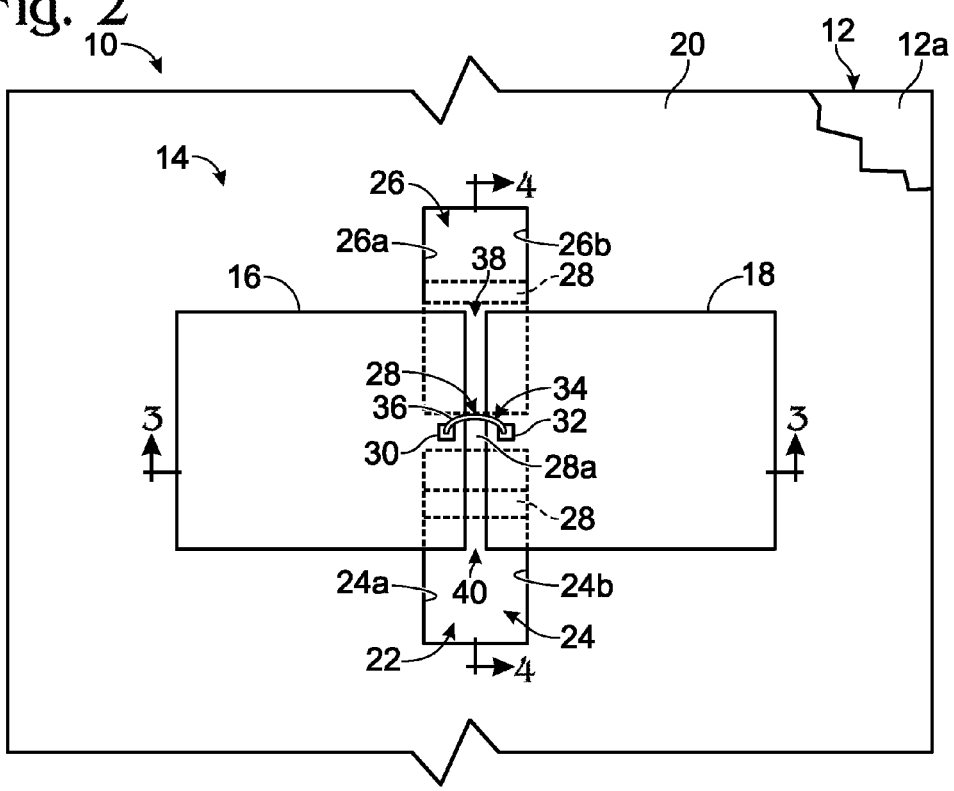
FIG. 2 shows a plan view of interconnected chips mounted on a substrate.

One or more circuit units may be positioned adjacent to a trench. The area near a portion of a circuit unit that is adjacent to a trench is referred to as an area 38 of adjacency. The figures show an example in which two circuit units 14 are positioned adjacent to a trench 22. The space between two circuit units may also be referred to as a gap 40. All or a portion of gap 40 may extend over trench 22. Gap 40 may be positioned completely or partially over trench 22 so that excess adhesive flows directly into the trench. Centering the gap over trench 22, as shown in FIG. 2, is not required, as the trench may be offset from the gap, and the gap may be wider than, the same width as, or narrower than the trench.

FIGS. 3A-3C illustrate steps of one example of a method of bonding a circuit unit onto a substrate. Initially, a base substrate 12 is selected. Trench 22 may be formed prior or subsequent to the placement of one or more circuit units on the substrate. In this example, as shown in FIG. 3A, trench 22 and bridge 28 are formed in substrate 12. An adhesive layer 20 is then laid down on top of substrate 12, as shown in FIG. 3B. Chips 16 and 18 are mounted side-by-side, as shown in FIG. 3C, which shows a cross-sectional view from the side of the mounted circuit chips. Terminals 30 and 32, positioned near the adjacent respective edges of chips 16 and 18, are interconnected using wire bond 34. Although interconnection of chips 16 and 18 may occur after mounting the chips on the adhesive layer, the chips may be interconnected prior to or during mounting of the chips.

Adhesive layer 20 may be conductive to provide a circuit ground circuit structure 10, including circuit chips 16 and 18. Adhesive 20 may be flowable, and may squeeze out from under one or both of the chips during mounting. Such excess adhesive may flow into the trench, rather than further out onto the substrate surface 12a. In this example, gap 40 between the chips may be small. The adhesive may thereby flow into the trench rather than up between the chips, and possibly on top of the chips, where it might flow onto terminal 30 or 32. In this way, the terminals may remain clear of adhesive, and interconnection may occur unimpeded by uncontrolled flow of adhesive.

Further, with a conductive adhesive, ground or circuit continuity is maintained, regardless of how much adhesive flows in trench 22. If bridge 28 is wide enough, adhesive may still accumulate on top of it, even to the point of overflowing onto the top of one or both of the chips.

More than one bridge 28 may be used to create a greater assurance of circuit continuity between chips 16 and 18, especially where conductive adhesive 20 may be less viscous. Also, trench 22 need not extend deeper into substrate 12 than is needed to accommodate enough adhesive to avoid build-up on top of a circuit chip. However, a trench 22 may be formed that is sufficiently deep to accommodate a range of amounts of excess adhesive.

Now referring to FIGS. 3C and 4, when chip 16 is mounted adjacent to chip 18 (or to some other above-the-substrate circuit unit) on substrate 12 using conductive adhesive 20, and in preparation for being electrically connected, an edge of at least one chip (16 or 18) may be placed adjacent bridge 28. Therefore, trench 22 receives any excess adhesive 20 during bonding, and bridge 28 allows adhesive 20 to remain continuous across the trench despite that some adhesive 20 drops into the trench. The continuity of adhesive 20 from the underside of each chip 16 and 18 to the space between the chips along bridge 28 is readily apparent in FIG. 3 and generally required to retain continuity of ground between chips 16 and 18. Depending on the viscosity of the adhesive layer, each bridge 28 may be formed with a width less than twice the height of an adjacent circuit chip or a height of the shortest chip. Adhesive may flow off of the sides of the bridge into the trench as well as directly from the chip into the trench. The likelihood that there will be a build-up of adhesive on the bridge above the height of a chip is reduced if the bridge width is less than or equal to the height of the shorter of the chips. Although the bridge may be positioned to the side of the chips, as shown in phantom lines in FIG. 2, it may also be positioned under interconnect 34. When in this latter position, adhesive ground layer 20 is directly under the interconnect, and the electromagnetic field between the interconnect and ground is relatively strong and well defined.

In another configuration (not shown), trench 22 may extended well beyond the sides of a circuit chip so as to accommodate the placement of additional circuit chips along the same trench. Thus, forming a mask for etching the trench may be simplified and a higher density of circuit units may be realized.

Accordingly, while embodiments have been particularly shown and described with reference to the foregoing disclosure, many variations may be made therein. The foregoing embodiments are illustrative, and no single feature or element is essential to all possible combinations that may be used in a particular application. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate or imply a required or limited number of such elements, and do not indicate a particular position or order of such elements unless otherwise specifically stated.

It is believed that the following claims particularly point out certain combinations and subcombinations that correspond to disclosed examples and are novel and non-obvious. Other combinations and subcombinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present disclosure.

INDUSTRIAL APPLICABILITY

The methods and apparatus described herein are applicable to the semiconductor, the telecommunication, and the communication-frequency signal processing industries, and are applicable to circuit technologies where circuit units may be mounted on a substrate.

What is claimed is:

1. A method comprising:
   forming a trench in a substrate having a face;
   covering the substrate face with a flowable conductive layer; and
   after covering the substrate face with the flowable conductive layer, mounting at least a first circuit chip on the flowable conductive layer with an edge of the first circuit chip adjacent to and directly over the trench in a manner causing a portion of the flowable conductive layer to flow into the trench.

2. The method of claim 1, further comprising mounting a second circuit chip on the flowable conductive layer adjacent the first circuit chip.

3. The method of claim 2, where the first and second circuit chips each have at least one terminal, and further comprising interconnecting the one terminals of the first and second circuit chips.

4. The method of claim 2, of which forming the trench includes forming at least one bridge spanning an intermediate portion of the trench.

5. The method of claim 4, of which forming the at least one bridge includes forming the at least one bridge with a width less than twice a height of one of the first and second circuit chips.

6. The method of claim 5, of which forming the at least one bridge further includes forming the at least one bridge with a width that is less than or equal to the height of the one circuit chip.

7. The method of claim 2, of which the edge of at least one of the circuit chips is mounted to extend at least partially over the trench.

8. The method of claim 4, of which forming the at least one bridge includes dividing the trench into one or more trench sections.

9. The method of claim 8, of which dividing the trench includes forming at least two separate trench sections, with one of the at least one bridge extending between ends of the trench sections.

10. A method comprising:
forming a trench having sidewalls in a substrate;
forming at least one bridge between the sidewalls of an intermediate portion of the trench;
applying a flowable adhesive to the substrate and the at least one bridge; and
after applying the flowable adhesive bonding a pair of circuit chips in adjacent relationship on the flowable adhesive with an area of adjacency of the circuit chips located generally over the trench and an excess portion of the flowable adhesive flowing into the trench, wherein at least one edge of the circuit chips extending directly over the at least one bridge and the intermediate portion of the trench.

11. The method of claim 10, further comprising interconnecting exposed terminals on the circuit chips.

12. The method of claim 10, of which forming the at least one bridge includes forming the at least one bridge with a width less than twice a height of one of the circuit chips 13. The method of claim 12, of which forming the at least one bridge further includes forming the at least one bridge with a width that is less than or equal to the height of the one circuit chip.

14. The method of claim 10, of which forming the at least one bridge includes dividing the trench into separate trench sections.

* * * * *